(12) United States Patent
Woods (10) Patent No.: US 7,061,285 B2
(45) Date of Patent: Jun. 13, 2006

(54) CLOCK DOUBLER

(76) Inventor: Paul R. Woods, 3781 NW. Tyler Pl., Corvallis, OR (US) 97330

( * ) Notice: Subject to any disclaimer, the term of this patent is extended or adjusted under 35 U.S.C. 154(b) by 27 days.

(21) Appl. No.: 10/826,197

(22) Filed: Apr. 15, 2004

(65) Prior Publication Data

US 2005/0231243 A1 Oct. 20, 2005

(51) Int. Cl.
H03B 19/00 (2006.01)

(52) U.S. Cl. .................. 327/122; 327/116; 327/119; 327/120; 327/121

(58) Field of Classification Search ............... 327/116, 327/119, 120, 121, 122
See application file for complete search history.

(56) References Cited

U.S. PATENT DOCUMENTS

| | | | | |
|---|---|---|---|---|
| 5,963,071 A | * | 10/1999 | Dowlatabadi | 327/175 |
| 5,994,930 A | * | 11/1999 | Park | 327/116 |
| 6,091,271 A | * | 7/2000 | Pant et al. | 327/122 |
| 6,094,076 A | * | 7/2000 | Saeki | 327/116 |
| 6,380,774 B1 | * | 4/2002 | Saeki | 327/119 |
| 6,441,657 B1 | * | 8/2002 | Saeki | 327/119 |
| 6,545,518 B1 | * | 4/2003 | Saeki | 327/116 |
| 2001/0056332 A1 | * | 12/2001 | Abrosimov et al. | 702/89 |
| 2003/0007162 A1 | * | 1/2003 | Blumer | 358/1.2 |

* cited by examiner

Primary Examiner—Kenneth B. Wells
Assistant Examiner—Khareem E. Almo (57) ABSTRACT

A clock doubler including clock doubling circuitry for generating from a system clock a clock signal having a frequency substantially double that of the system clock and also having a pulse width and associated duty cycle is provided. Timing circuitry for generating a first signal indicative of the time the clock signal is low and a second signal indicative of the time the clock signal is high provides an input to comparison circuitry for comparing the first signal and the second signal. Pulse width varying circuitry varies the pulse width of the clock signal based on the result of comparing the first signal and the second signal.

21 Claims, 7 Drawing Sheets

CLOCK DOUBLER

BACKGROUND ART

Systems employing computers often provide one or more clock sources that can be used as a system clock to drive the processor, other components of the system, or the entire system. It is sometimes desired to provide a clock signal having a faster frequency to a portion of the system than that of a given clock source available in the system. For example, it may be desired to double the clock signal generated by a given clock source. In order to increase internal operating speed, circuit designers sometimes use clock frequency doublers, or clock doublers.

Clock doublers also are widely employed in integrated circuit, or chip, designs to increase the frequency of an off-chip reference clock signal for internal use within the integrated circuit, such as in application specific integrated circuits (ASIC) and in microprocessor designs.

DISCLOSURE OF THE INVENTION

The present invention provides a clock doubler including clock doubling circuitry for generating from a system clock a clock signal having a frequency substantially double that of the system clock and having a pulse width and associated duty cycle. Timing circuitry for generating a first signal indicative of the time the clock signal is low and a second signal indicative of the time the clock signal is high provides an input to comparison circuitry for comparing the first signal and the second signal. Pulse width varying circuitry varies the pulse width of the clock signal based on the result of comparing the first signal and the second signal.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent from a reading of this disclosure that the invention may be practiced without these specific details. In order to avoid obscuring the present invention, some well-known circuits, system configurations, and process steps are not disclosed in detail.

Likewise, the drawings showing embodiments of the invention are semi-diagrammatic and not to scale and, particularly, some of the dimensions are for the clarity of presentation and are shown greatly exaggerated in the FIGs. In addition, where multiple embodiments are disclosed and described having some features in common, for clarity and ease of illustration and description thereof like features one to another will ordinarily be described with like reference numerals.

Figure 1:
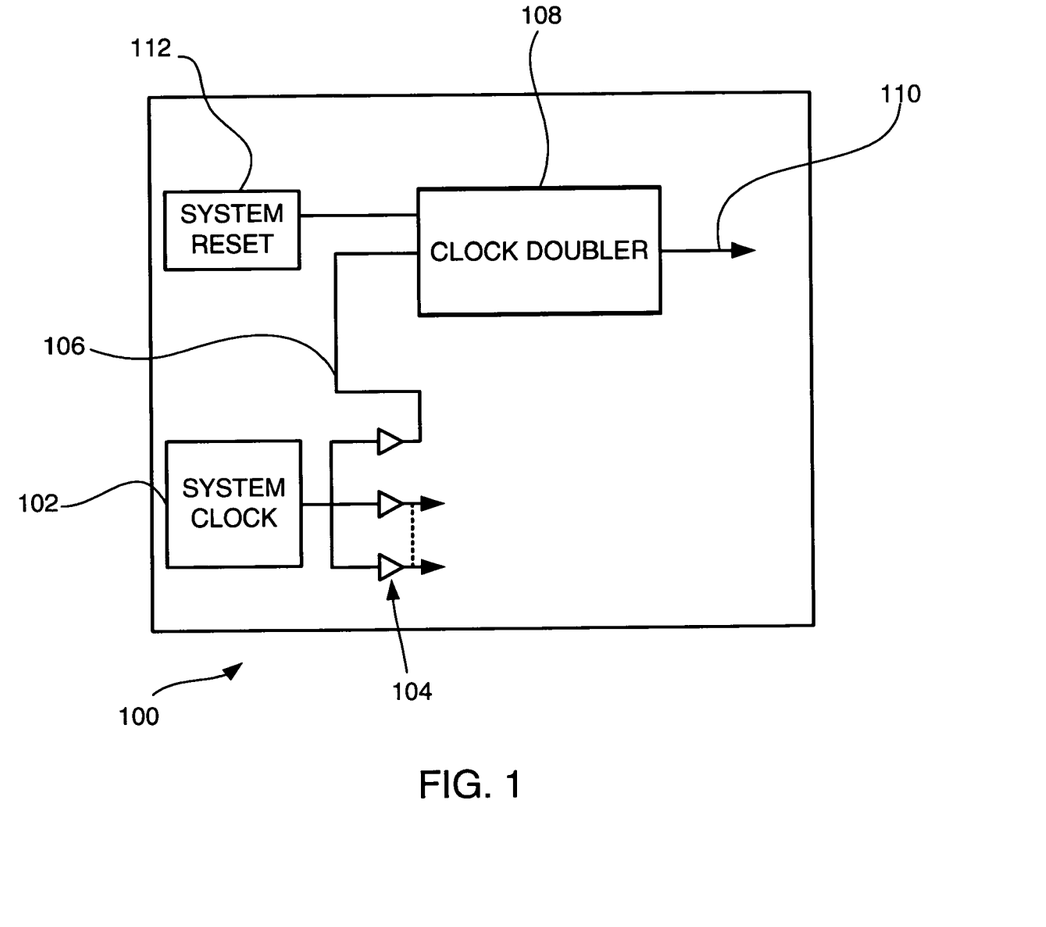
FIG. 1 is a block diagram of a system having a clock doubler according to one embodiment of the present invention.

Referring now to FIG. 1, therein is shown a system 100, such as an application specific integrated circuit (ASIC), or a system on a chip (SOC). The system 100 includes a system clock 102 that provides clock signals to various components of the system 100 through a number of amplifiers 104. The system clock 102 also provides an input 106 to a clock doubler 108. The clock doubler 108 has an output 110 that has a frequency that is twice the frequency of the system clock 102. The system 100 also has a system reset 112 that may be used to reset the clock doubler 108.

Figure 2:
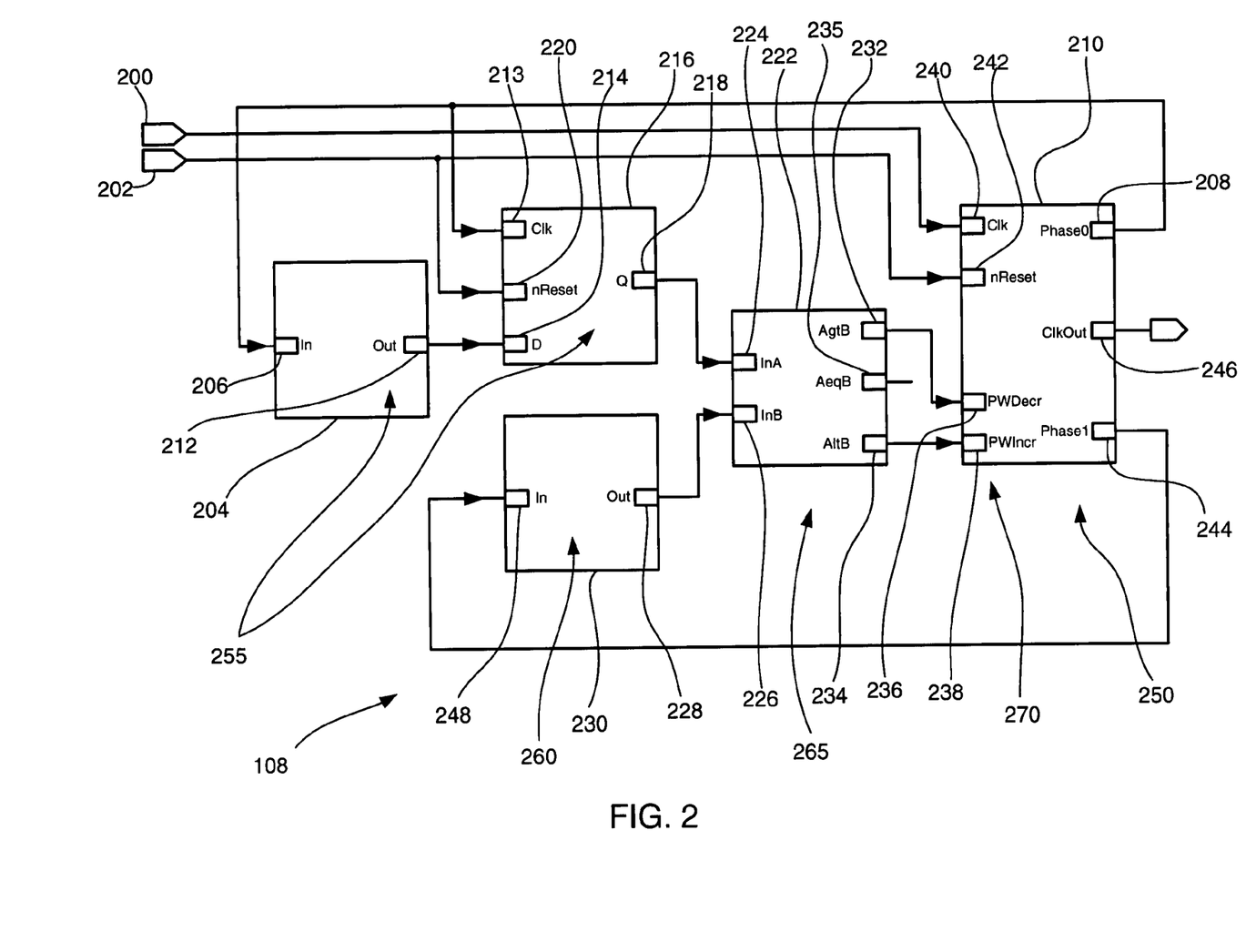
FIG. 2 is a circuit diagram of the clock doubler of FIG. 1 including a clock splitter, a tap delay, a comparator.

Referring now to FIG. 2, therein is shown a circuit diagram of the clock doubler 108 shown in FIG. 1. The clock doubler 108 includes a clock (Clk) input 200 from the system clock 102 shown in FIG. 1. The clock doubler 108 also has an nReset input 202 that can be used to reset the clock doubler 108.

The clock doubler 108 includes a first Tap Delay Line (TDL) 204. The first TDL 204 has an In input 206 connected to a Phase0 output 208 of a clock splitter 210, and a number of outputs represented by an Out output bus 212. The number of outputs comprising the Out output bus 212 can vary depending upon the resolution required or needed in a particular design. In the embodiment shown in FIG. 2, the Out output bus 212 represents eight outputs.

The Out output bus 212 is connected to a D input 214 of a register 216. The register 216 also has a Clk input 213 connected to the Clk input 200, and a nReset input 220 connected to the nReset input 202 of the clock doubler 108. The register 216 has a Q output 218. The Q output 218 also may include a number of outputs depending upon the resolution desired. In the example shown in FIG. 2 the Q output 218 represents eight outputs.

A comparator 222 has an InA input 224 that is connected to and receives the Q output 218 from the register 216. Accordingly, the InA input 224 has at least the same number of lines as the number of lines in the Q output 218. The comparator 222 also has an InB input 226 that is connected to an Out output bus 228 of a second TDL 230, or Tap Delay Line. The comparator 222 has an A is greater than B (AgtB) output 232 and an A is less than B (AltB) output 234. The AgtB output 232 is generated if the InA input 224 is greater than the InB input 226. The AltB output 234 is generated if the InA input 224 is less than the InB input 226.

The AgtB output 232 of the comparator 222 is connected to a Pulse Width Decrement (PWDecr) input 236 of the clock splitter 210. The AltB output 234 of the comparator 222 is connected to a Pulse Width Increment (PWIncr) input 238 of the clock splitter 210. The clock splitter 210 includes a Clk input 240 and a negative Reset (nReset) input 242 connected to the Clk input 200 and the nReset input 202 of the clock doubler 108, respectively.

The PWDecr input 236 receives a signal if the InA input 224 of the comparator 222 is greater than the InB input 226 of the comparator 222 and is indicative of the need to decrement the pulse width of a ClkOut output 246 of the clock splitter 210. The PWIncr input 238 receives a signal if the InA input 224 of the comparator 222 is less than the InB input 226 of the comparator 222 and is indicative of the need to increment the pulse width of the ClkOut output 246 of the clock splitter 210.

The clock splitter 210 has a Phase1 output 244 and the ClkOut output 246. The Phase1 output 244 is connected to an In input 248 of the second TDL 230. The ClkOut output 246 has a frequency that is double the frequency of the Clk input 200.

In operation, every time the Clk input 200 shown in FIG. 2 goes high, the Out output bus 212 of the first TDL 204 is stored in the register 216. Accordingly, when the Clk input 200 goes high, the Out output bus 212 of the first TDL 204 can be compared to an Out output bus 228 of the second TDL 230 by the comparator 222. The Out output bus 212 of the first TDL 204 and the Out output bus 228 of the second TDL 230 are representative of the pulse width based respectively on the time the ClkOut output 246 is high or is low.

The objective is to make the lengths, or pulse widths, of when the ClkOut output 246 is high, the same as when the ClkOut output 246 is low. The comparator 222 compares the Out output bus 212 of the first TDL 204 and the Out output bus 228 of the second TDL 230. If one output is larger than the other is, the comparator will generate a signal at the appropriate output of the comparator 222. If the InA input 224 is greater than the InB input 226 the AgtB output 232 receives an output signal. If the InB input 226 is greater than the InA input 224 an AltB output 234 receives an output signal.

The AgtB output 232 of the comparator 222 is connected to the PWDecr input 236 of the clock splitter 210. If the AgtB output receives a signal from the comparator 222, the PWDecr input 236 of the clock splitter 210 receives that signal and the clock splitter 210 generates a signal that decreases the time the ClkOut output 246 is high. If the AltB output 234 receives a signal from the comparator 222, the PWIncr input 238 of the clock splitter 210 receives that signal and the clock splitter 210 generates a signal that increases the time the ClkOut output 246 is high.

A clock doubler circuitry 250 includes the clock splitter 210. The clock doubler circuitry 250 generates a ClkOut output 246 that has a frequency substantially double the frequency of the Clk input 200, or system clock.

The first tap delay line 204 and the register 216 act as a timing circuitry 255 to measure the Phase0 output high time. The second tap delay line 230 acts as the second timing circuitry 260 to measure the Phase1 output 244 high time, which is the same as Phase0 low time, of the clock splitter 210.

The comparator 222 includes a comparison circuitry 265 for comparing the output 218 from the first timing circuitry 255 and the Out output bus 228 from the second timing circuitry 260. The comparison circuitry 265 is described in more detail below with reference to FIG. 5.

The PWDecr input 236 and the PWIncr input 238 of the clock splitter comprise a pulse width varying circuitry 270. The pulse width varying circuitry 270 increments or decrements the pulse width of the ClkOut output 246 of the clock splitter 210.

Figure 3:
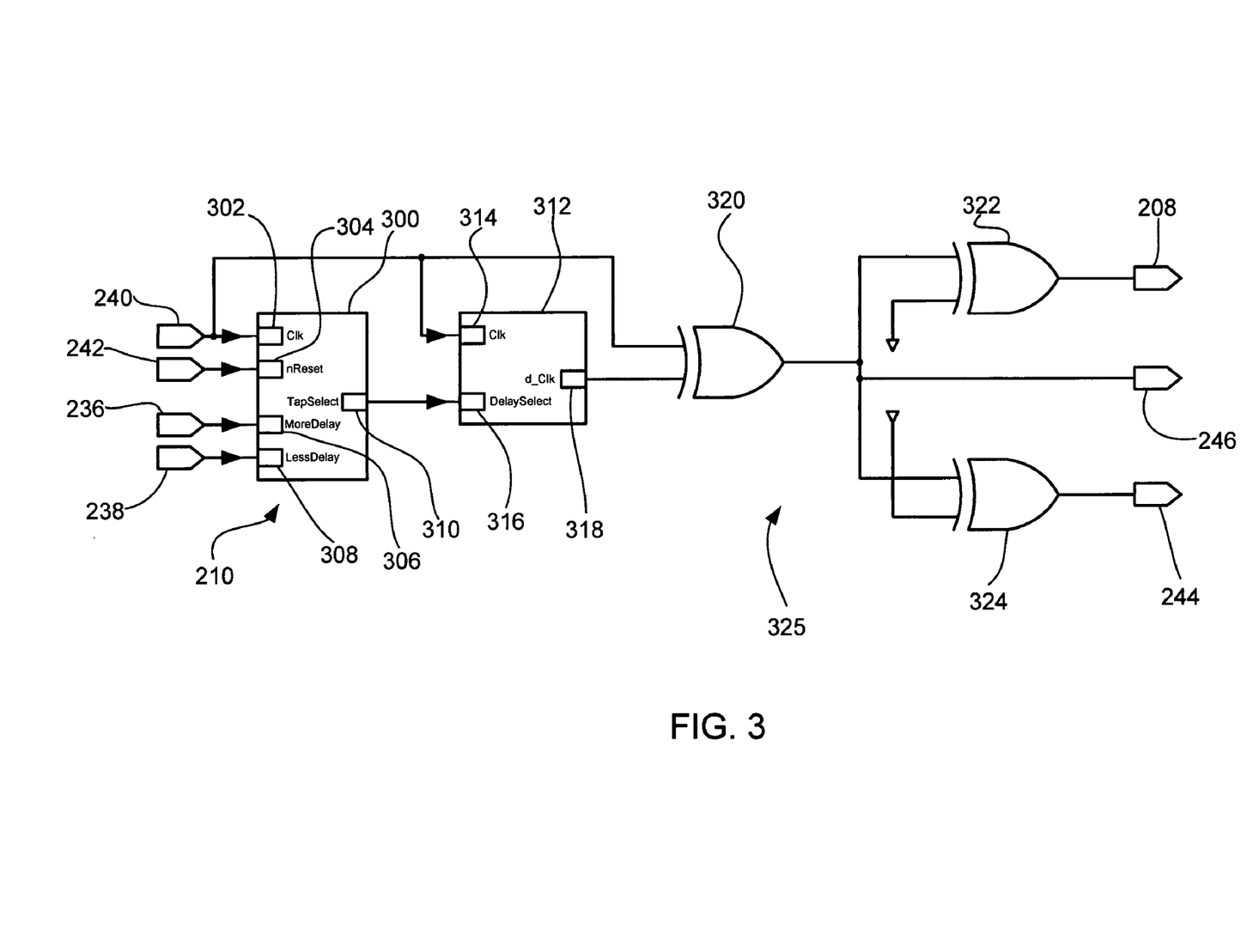
FIG. 3 is a circuit diagram of the clock splitter shown in FIG. 2 including a delay chain.

Referring now to FIG. 3, therein is shown a circuit diagram of the clock splitter 210 shown in FIG. 2. The clock splitter 210 includes a delay control 300, such as an up/down scaler. The delay control 300 has a Clk input 302 connected to the Clk input 200, and an nReset input 304 connected to the nReset input 242. A MoreDelay input 306 is connected to the PWDecr input 236, and a LessDelay input 308 is connected to the PWIncr input 238. The delay control 300 also has a TapSelect output 310 representative of a number of outputs depending upon the resolution required for a particular design. In the embodiment shown in FIG. 3 the TapSelect output 310 is representative of 16 outputs.

The clock splitter 210 also includes a delay chain 312. The delay chain 312 includes a Clk input 314 connected to the Clk input 240 and a DelaySelect input 316 connected to the TapSelect output 310 of the delay control 300. The delay chain 312 has a d_Clk output 318 that is adjusted based on the delay selected by the delay control 300.

The Clk input 240 and the d_Clk output 318 are inputs to a first exclusive OR (XOR) gate 320. The first XOR gate 320 has as its output the ClkOut output 246 that is twice the frequency of the Clk input 240. The ClkOut output 246 is connected to a second XOR gate 322 and a third XOR gate 324. The other input of the second XOR gate 322 is connected to ground, and the other input of the third XOR gate 324 is connected to a logic one.

The output of the second XOR gate 322 is the Phase0 output 208. The output of the third XOR gate 324 is the Phase1 output 244.

In operation, the clock splitter 210 receives the Clk input 240, and generates a chain of pulses that propagates through the delay chain 312. While the Clk input 240 enters the clock splitter 210 as a logical one, it will take some time for the Clk input 240 to propagate through the delay chain 312, so the d_Clk output 318 of the delay chain 312 would initially be a logical zero until the logic one has passed through the delay chain 312.

One input of the first XOR gate 320 will be at a logical one, so the output of the first XOR gate 320 will be at a logical one. The output of the first XOR gate 320 will stay at that the level of a logical one until the Clk input 240 propagates through the delay chain 312 and the d_Clk output 318 of the delay chain 312 goes to a logical one. At that time, the inputs to the first XOR gate 320 will both be at a logical one. Accordingly, that will provide a logical zero output of the first XOR gate 320 thus providing a pulse associated with the rising edge of the Clk input 240 when it transitions from a logical zero to a logical one. Similarly, the same logic applies with respect to the falling edge of the Clk input 240, or a transition from a logical one to a logical zero.

The output of the first XOR gate 320 provides an input to the second XOR gate 322 and the third XOR gate 324. A second input of the second XOR gate 322 is connected to a logical zero signal. A second input of the third XOR gate 324 is connected to a logical one signal. The third XOR gate 324 always inverts the output of the first XOR gate 320, so the Phase1 output 244 shown in FIG. 2 will be an inverted signal with respect to the Phase0 output 208 shown in FIG. 2.

The second XOR gate 322 and the third XOR gate 324 are connected in parallel so there will be some finite propagation delay of the output of the first XOR gate 320 through either the second XOR gate 322 or the third XOR gate 324. Therefore, the output of the first XOR gate 320, whether inverted or not, has the same propagation delay to the Phase0 output 208 or the Phase1 output 244.

The delay control 300 acts as an up/down counter or scaler. The TapSelect output 310 of the delay control 300 controls the length of delay in the delay chain 312. The width of the pulses at the output of the first XOR gate 320 depends on how long it takes for the Clk input 240 to propagate through the delay chain 312. Adjusting the delay chain 312 controls the length of the output pulses of the first XOR gate 320.

The first XOR gate 320, the second XOR gate 322, and the third XOR gate 324 comprise a logic circuitry 325. Other arrangements of logic elements can be arranged to perform the function of the logic circuitry 325.

Figure 4:
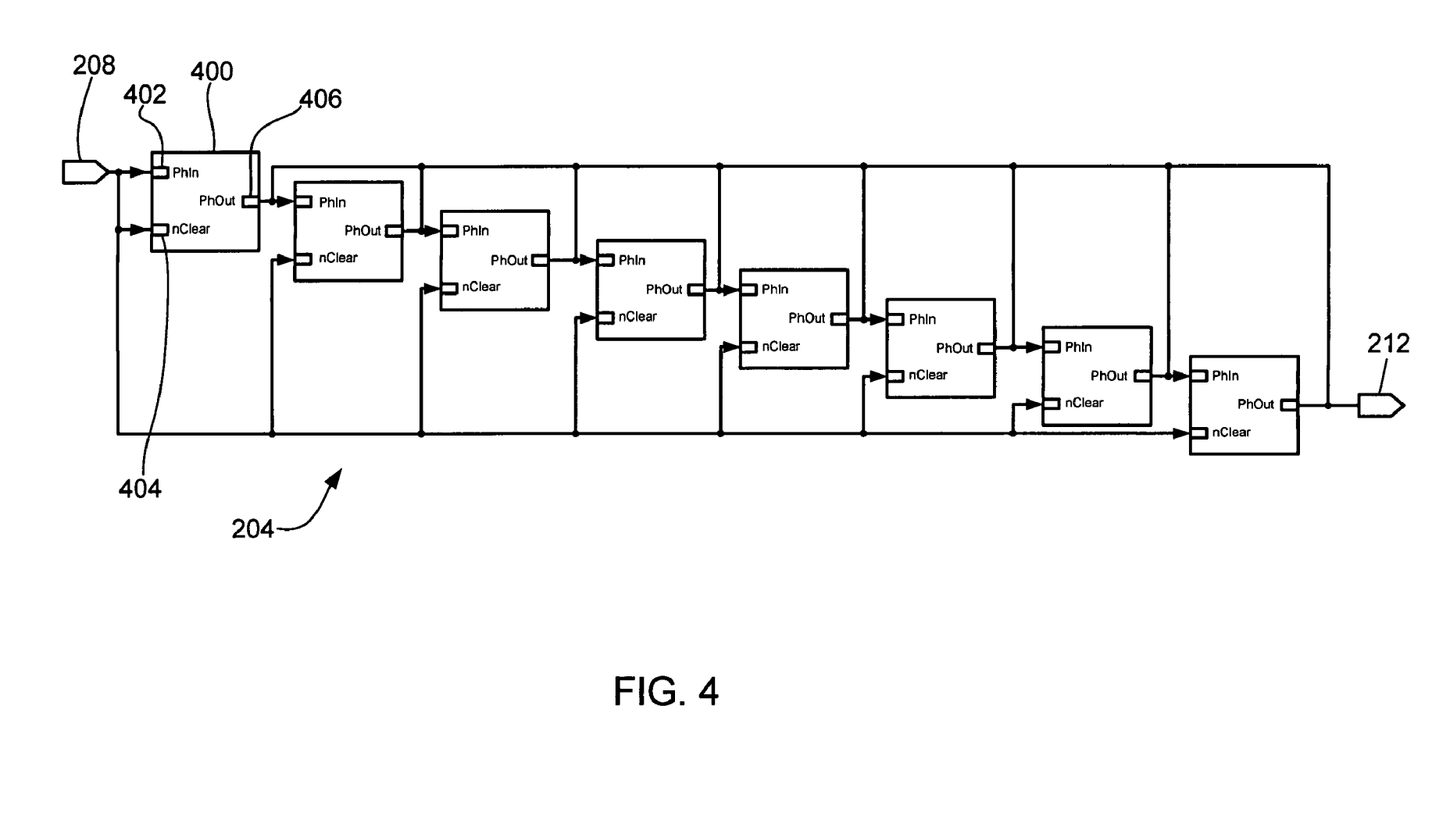
FIG. 4 is a circuit diagram of a number of tap delay cells of the tap delay shown in FIG. 2.

Referring now to FIG. 4 therein is shown a circuit diagram of a number of TDL cells 400 of the first TDL 204 and the second TDL 230 shown in FIG. 2. The first TDL 204 and the second TDL 230 are constructed the same.

The first TDL 204 includes the number of TDL cells 400. Each of the number of TDL cells 400 includes a phase in (PhIn) input 402 and a negative Clear (nClear) input 404 that are connected to the PhIn input 402 of the first of the number of TDL cells 400. The PhIn input of the first of the number of TDL cells 400 is connected to the Phase0 output 208 of the clock splitter 210 shown in FIGS. 2 and 3.

The output of each of the number of TDL cells 400 is a phase out (PhOut) output 406. The PhOut output 406 of each of the TDL cells 400 in the cascading arrangement of the number of TDL cells 400 is connected to the Out output bus 212. The PhOut output 406 of each of the number of TDL cells 400 represents the PhIn input 402 of that one of the number of TDL cells 400 delayed by the timing of the particular one of the number of TDL cells 400.

The second TDL 230 is constructed the same as the first TDL 204 using the number of TDL cells 400. However, the PhIn input 402 of the first of the number of TDL cells 400 in the second TDL 230 shown in FIG. 2 is connected to the Phase1 output 244 of the clock splitter 210 shown in FIGS. 2 and 3. The PhOut output 406 of each of the number of TDL cells 400 of the second TDL 230 shown in FIG. 2 is connected to the Out output bus 228 of the second TDL 230 shown in FIG. 2.

In operation, each of the number of TDL cells 400 has some nominal delay and the PhOut output 406 of one of the number of TDL cells 400 is the PhIn input 402 of the next one of the number of TDL cells 400. The PhIn input 402 of the first of the number of TDL cells 400 is the Phase0 output 208 of the clock splitter 210 shown in FIGS. 2 and 3. The Phase0 output 208 cascades through each of the number of TDL cells 400 thereby introducing a delay due to the cascading of the Phase0 output 208 through the number of TDL cells 400.

As the Phase0 output 208 cascades through the number of TDL cells 400, the Out output bus 212 in the first TDL 204 will change based on the transition of the Phase0 output 208 between a logical high signal and a logical low signal. This form of code is sometimes referred to as a thermometer code where a certain number of adjacent logical low signals and a certain number of adjacent logical high signals are generated starting with the least significant bit on the Out output bus 212. It is not a binary code, but rather identifies the transitions between logical high signals and logical low signals.

The second TDL 230 is identical to the first TDL 204 and operates the same way except that the PhIn input 402 to the second TDL 230 is the Phase1 output 244 of the clock splitter 210 shown in FIGS. 2 and 3.

Figure 5:
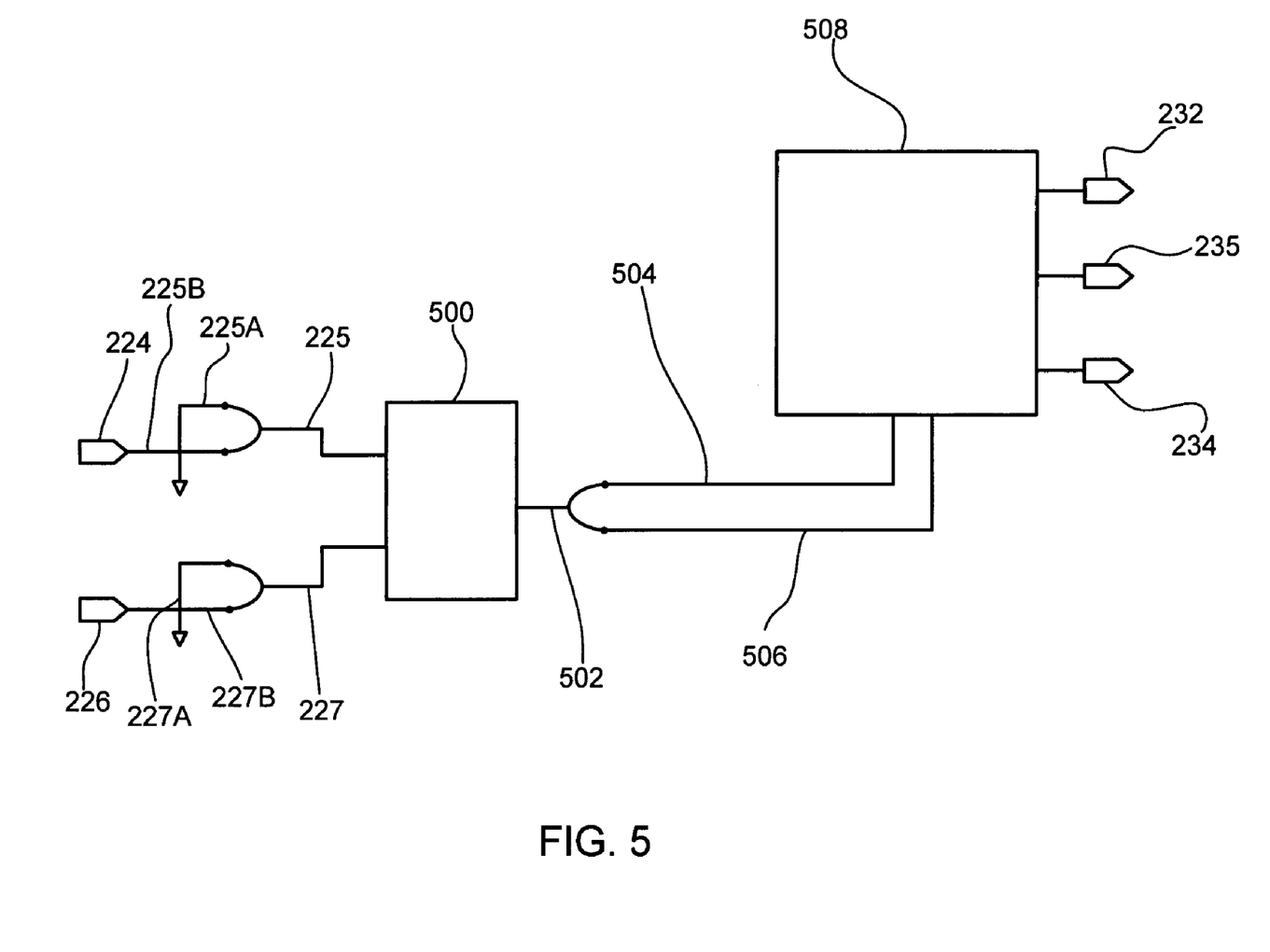
FIG. 5 is a circuit diagram of the comparator shown in FIG. 2.

Referring now to FIG. 5, therein is shown a circuit diagram of the comparator 222 shown in FIG. 2. The comparator 222 includes the InA input 224 and the InB input 226 shown in FIG. 2. A sign bit 225A for the InA input 224 is connected to a logical low signal indicative of there being no sign associated with the InA input 224. The value on a bus 225B is indicative of the value of the magnitude of the InA input 224. A second sign bit 227A for the InB input 226 is connected to a logical low signal indicative of there being no sign associated with the InB input 226. The value on a bus 227B is indicative of the value of the magnitude of the InB input 226.

The InA input 224 and the InB input 226 are inputs to a first function block 500, such as a digital subtractor by way of the first bus 225 and a second bus 227 respectively. The first function block 500 has an output bus 502 that includes a sign output 504 and a difference output 506. The sign output 504 is indicative of which of the InA input 224 or the InB input 226 is the greater of the two inputs, and the difference output 506 is indicative of the magnitude of the difference between the InA input 224 and the InB input 226. Accordingly, the sign output 504 can be one conductor, and the difference output 506 can be several conductors in the output bus 502. The first sign bit 225A and the second sign bit 227A are used as place-holders on the first bus 225 and the second bus 227 respectively to allow the sign of the result to be represented on the output bus 502.

The sign output 504 and the difference output 506 are inputs to a second function block 508. The outputs of the second function block 508 are the AgtB output 232, an AeqB output 235, and the AltB output 234 of the comparator shown in FIG. 2. A signal is generated on one of the outputs of the second function block 508 depending upon the results of the comparison made by the first function block 500.

If the InA input 224 is greater than the InB input 226, the AgtB output 232 is generated by the second function block 508. If the InA input is equal to the InB input, the AeqB output 235 is generated by the second function block 508. If the InA input 224 is less than the InB input 226, the AltB output is generated by the second function block 508.

In operation, the first function block 500 is designed to determine the relationship between the InA input 224 and the InB input 226, for example, the magnitude of the InB input is subtracted from the magnitude of the InA input 224 to provide a sign bit on the sign output 504 and a magnitude value on the difference output 506. The sign output 504 and the difference output 506 are inputs to the second function block 508.

The second function block 508 has an output based on the relationship of the InA input 224 and the InB input 226 as represented by the values on the sign output 504 and the difference output 506 determined by the first function block 500. If the InA input 224 is greater than the InB input 226, the second function block 508 generates an output on the AgtB output 232. If the InA input 224 is less than the InB input 226, the second function block 508 generates an output on the AltB output 234. If the InA input and the InB input are equal the second function block generates an output on the AeqB output 235. The AgtB output 232, the AltB output 234, and the AeqB output 235 of the comparator are inputs to the clock splitter 210 as shown in FIG. 2.

Figure 6:
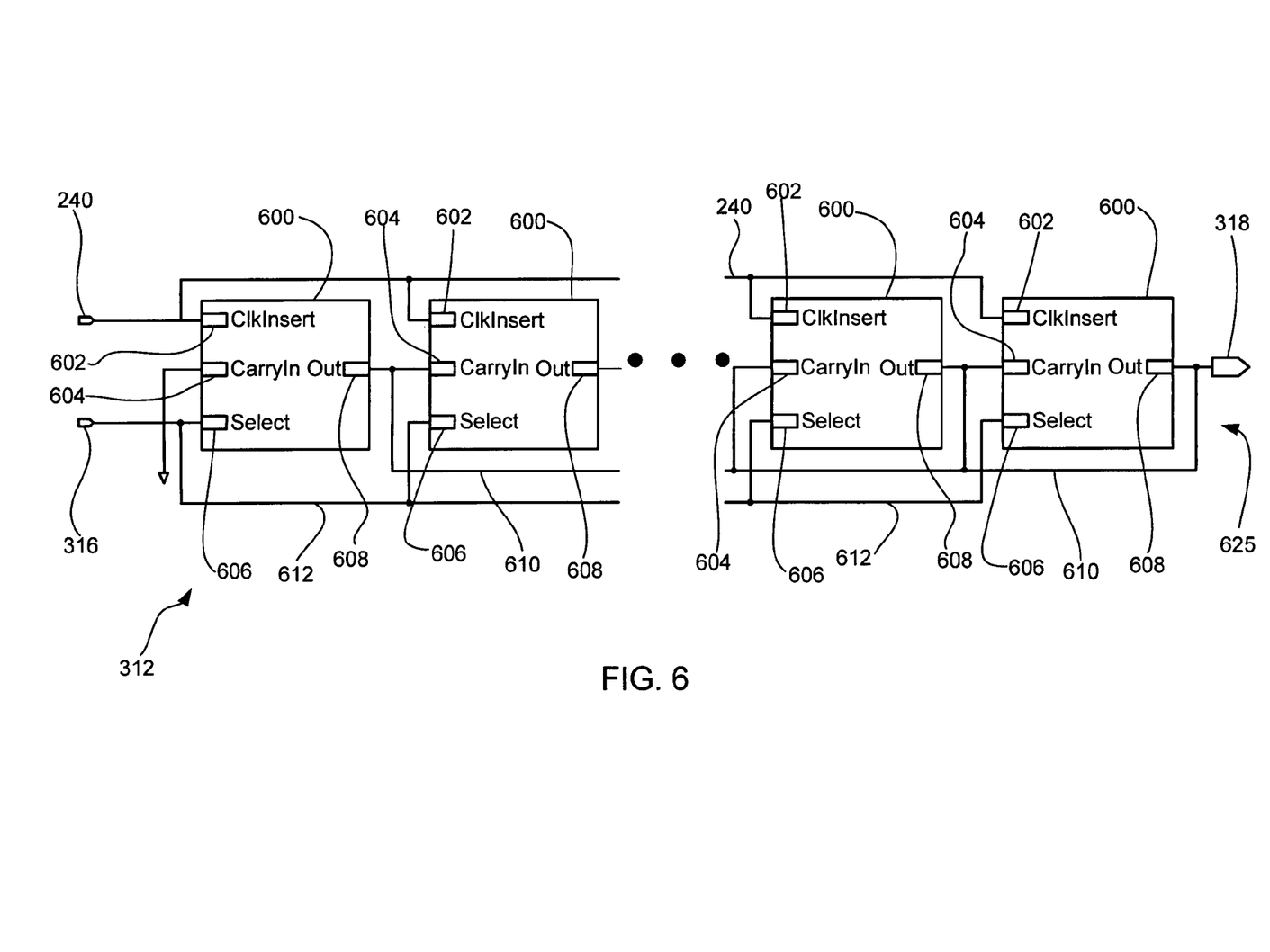
FIG. 6 is a circuit diagram of the delay chain shown in FIG. 3.

Referring now to FIG. 6, therein is shown a circuit diagram of the delay chain 312 shown in FIG. 3. The delay chain 312 includes a number of delay elements 600 connected in a cascading arrangement to generate the d_Clk output 318 shown in FIG. 3. The number of delay elements may vary depending upon the amount of resolution required for a particular design or application.

Each of the number of delay elements 600 includes a ClkInsert input 602 to which the Clk input 240 is connected. Each of the number of delay elements 600 also has a CarryIn input 604, a Select input 606, and an Out output 608. The CarryIn input 604 of the first of the number of delay elements 600 in the delay chain 312 is connected to a logical low source. The DelaySelect input 316 is connected to the Select input 606 of the first of the number of delay elements 600 in the delay chain 312. The Out output of the first of the number of delay elements 600 of the delay chain 312 is connected to the CarryIn input 604 of the next succeeding delay element in the number of delay elements 600 in the delay chain 312.

The Delay Select input 316 shown in FIG. 3 is an input to the Select input 606 of each of the delay elements 600 in the delay chain 312. The Out output 608 of each of the delay elements 600 is connected to the CarryIn input 604 of the next adjacent delay element in the number of delay elements 600 in the delay chain 312. The output of the last delay element in the number of delay elements 600 in the cascading arrangement is the d_Clk output 318 shown in FIG. 3.

A taps bus 610 for reading the output of a particular delay element is connected to the Out output 608 of each of the number of delay elements 600.

The Select input 606 of each of the number of delay elements 600 is connected to a Delay Select bus 612 for adjusting the delay based on the particular delay element selected on the Delay Select bus 612. Accordingly, the timing and output of the delay chain 312 shown in FIG. 3 can be varied by selecting a particular delay element of the number of delay elements 600 in the delay chain 312, or by reading the Out output 608 of a particular delay element of the number of delay elements 600 in the delay chain 312.

In operation, the Clk input 240 propagates through the delay chain 312 by means of the number of delay elements 600. The number of delay elements 600 can vary depending upon the amount of control that is required for a particular design. The length of the delay through the delay chain 312 is controlled by selectively directing the Clk input 240 to a particular delay element in the number of delay elements 600 in the delay chain 312 by selecting a particular delay element using the Delay Select bus 612. If the Clk input 240 is directed to the ClkInsert input 602 of the last delay element in the number of delay elements 600 in the delay chain 312 by selecting the last delay element using the Delay Select bus 612, the delay would be the maximum. If the Clk input 240 is directed to the ClkInsert input 602 of another delay element in the number of delay elements 600 in the delay chain 312, the delay is shorter than the maximum. Thus, the amount of the delay through the delay chain 312 can be controlled by a one-hot encoded value being applied to the Delay Select bus 612.

Within each delay element of the number of delay elements 600 the Out output 608 is the delayed combination of the ClkInsert input 602, the CarryIn input 604 and the Select input 606. The ClkInsert input 602 and the Select input 606 are combined by performing a logical AND operation and then performing a logical OR operation with that result and the CarryIn input 604 to generate a delay within each delay element of the number of delay elements 600.

The Delay Select bus 612 sends a signal to the selected delay element in the number of delay elements 600 to direct the Clk input 240 to the ClkInsert input 602 of a particular delay element in the number of delay elements 600 in the delay chain 612.

Thus, a variable delay chain circuitry 625 can be implemented in a variety of ways to meet the requirements for various designs. The number of delay elements 600 can be varied to provide differing levels of control in the clock doubler 108 shown in FIG. 1.

Figure 7:
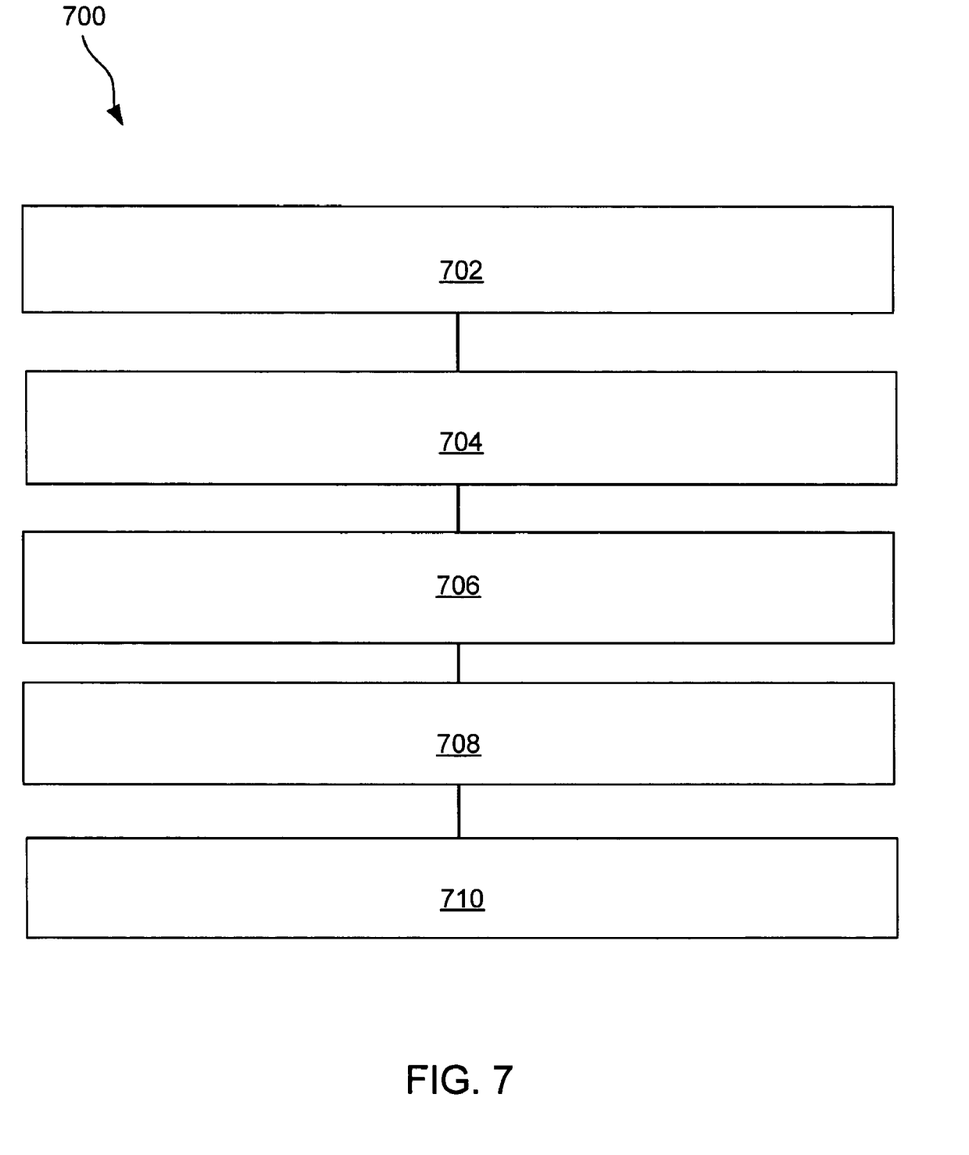
FIG. 7 is a flow chart of a method in accordance with an embodiment of the present invention.

Referring now to FIG. 7, therein is shown a flow chart of a method 700 for correcting the duty cycle of a clock doubler in accordance with the present invention. The method 700 includes generating from a system clock signal a clock signal having a frequency substantially double that of the system clock signal and also having a pulse width and associated duty cycle, in a block 702; generating a first signal indicative of the time the clock signal is low, in a block 704; generating a second signal indicative of the time the clock signal is high, in a block 706; comparing the first signal and the second signal, in a block 708; and varying the pulse width of the clock signal base on the result of comparing the first signal and the second signal, in a block 710.

Thus, it has been discovered that the method and apparatus of the present invention furnish important and heretofore unavailable solutions, capabilities, and functional advantages for providing a clock doubler with auto correcting duty cycle. The resulting process and configurations are straightforward, economical, uncomplicated, highly versatile, and effective, use conventional technologies, and are thus readily suited for manufacturing devices that are fully compatible with conventional manufacturing processes and technologies.

For many design applications, it is important that the duty cycle of the clock signal be maintained at about 50%. The time the clock is high is about the same as the time the clock is low. Variations in the duty cycle are inherent in systems such as integrated circuit chips due to variations in the manufacturing processing of the chip, due to the voltage that the chip is operated at, and the temperature. The present invention actively tracks the duty cycle and automatically corrects for variations in the duty cycle as the changes occur.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters set forth herein or shown in the accompanying drawings are to be interpreted in an illustrative and non-limiting sense.

The invention claimed is:

1. A clock doubler comprising:
    clock doubling circuitry for generating from a system clock an output clock signal having a frequency substantially double that of the system clock and also having a pulse width and associated duty cycle;
    timing circuitry for generating a first signal indicative of the time the output clock signal is low, and a second signal indicative of the time the output clock signal is high
    comparison circuitry for comparing the first signal and the second signal; pulse width varying circuitry for varying the pulse width of the output clock signal based on the result of comparing the first signal and the second signal; and
    a tap delay line connected to receive at least the first signal, wherein:
        the timing circuitry tracks the delay through the tap delay line; and
        the first signal is indicative of the delay through the tap delay line.

2. The clock doubler as claimed in claim 1 wherein:
    the clock doubling circuitry comprises a clock splitter.

3. The clock doubler as claimed in claim 1, further comprising:
    a second tap delay line for delaying the second signal, wherein:
        the comparison circuitry uses a comparator, the comparator comprising:
            a first input indicative of the delay through the first tap delay line;

a second input indicative of the delay through the second tap delay line; and outputs indicative of whether the first signal is greater than, less than, or equal to the second signal.

4. The clock doubler as claimed in claim 1, further comprising:
variable delay chain circuitry for controllably varying the delay of the output clock signal.

5. The clock doubler as claimed in claim 1, further comprising:
delay chain circuitry for controllably delaying the output clock signal, wherein:
the pulse width varying circuitry varies the delay of the output clock signal through the delay chain circuitry.

6. The clock doubler as claimed in claim 1, further comprising:
delay chain circuitry for varying the delay of the output clock signal;
delay control circuitry for controllably varying the length of the delay chain; and
phase determining circuitry for determining the amount of time the output clock signal is high and the time the output clock signal is low.

7. A clock doubler for varying a system clock to generate a second clock signal comprising:
a clock splitter having a first output indicative of the time the second clock signal is low and a second output indicative of the time the second clock signal is high;
a first tap delay line connected to receive the first output and having a first tap delay output;
a second tap delay line connected to receive the second output and having a second tap delay output;
a comparator connected to receive:
the first tap delay line output as a first comparator input;
the second tap delay line output as a second comparator input; and
a comparator output indicative of whether the first comparator input is greater than, less than, or equal to the second comparator input; and
whereby the time the second clock signal is low or high is variably controlled by the comparator output.

8. The clock doubler as claimed in claim 7, wherein the clock splitter comprises:
a delay chain having variably controlled length;
a delay control for variably controlling the length of the delay chain; and
logic circuitry for tracking the time the second clock signal is low and tracking the time the second clock signal is high.

9. The clock doubler as claimed in claim 7 wherein the clock splitter comprises:
a delay chain having a variably controlled length of delay chain elements; and
a delay control for selecting a specific delay chain element in the delay chain.

10. The clock doubler as claimed in claim 7, wherein:
the first tap delay line and the second tap delay line each comprises:
a number of tap delay cells connected to delay the propagation of the first output through the tap delay cells.

11. The clock doubler as claimed in claim 7, wherein the comparator comprises:
a subtractor for performing a subtraction function on the value of the first output and the value of the second output; and a function generator connected to the subtractor for generating the comparator output.

12. The clock doubler as claimed in claim 7 further comprising:
a register having an input connected to the first tap delay line output; and
a register output connected to the first comparator input.

13. The clock doubler as claimed in claim 7 wherein:
the comparator output is indicative of incrementing the time the second clock signal is low if the first output of the clock splitter is greater than the second output of the clock splitter; and
the comparator output is indicative of decrementing the time the second clock signal is low if the first output of the clock splitter is less than the second output of the clock splitter.

14. A method of correcting the duty cycle of a clock doubler comprising:
generating from a system clock a clock signal having a frequency substantially double that of the system clock and also having a pulse width and associated duty cycle;
generating a first signal indicative of the time the clock signal is low;
generating a second signal indicative of the time the clock signal is high comparing the first signal and the second signal; varying the pulse width of the clock signal base on the result of comparing the first signal and the second signal;
generating the first signal and generating the second signal generates a signal by tracking the delay through a tap delay line; and
the magnitude of the tracking signal is indicative of the delay through the tap delay line.

15. The method of correcting the duty cycle of a clock doubler as claimed in claim 14 wherein:
generating a clock signal uses a clock splitter.

16. The method of correcting the duty cycle of a clock doubler as claimed in claim 14 wherein comparing the first signal and the second signal uses a comparator:
having a first input indicative of the delay through the tap delay line of the first signal;
having a second input indicative of the delay through the tap delay line of the second signal; and
having outputs indicative of whether the first signal is greater than, less than, or equal to the second signal.

17. The method of correcting the duty cycle of a clock doubler as claimed in claim 14 wherein:
varying the pulse width of the clock signal varies the delay of the clock signal through a delay chain.

18. The method of correcting the duty cycle of a clock doubler as claimed in claim 14 wherein:
varying the pulse width of the clock signal increments the time the clock signal is low if the first signal is greater than the second signal; and
decrements the time the clock signal is low if the first signal is less than the second signal.

19. A clock doubler comprising:
clock doubling circuitry for generating from a system clock a clock signal having a frequency substantially double that of the system clock and also having a pulse width and associated duty cycle;
timing circuitry for generating a first signal indicative of the time the clock signal is low, and a second signal indicative of the time the clock signal is high
comparison circuitry for comparing the first signal and the second signal;

pulse width varying circuitry for varying the pulse width of the clock signal based on the result of comparing the first signal and the second signal; and a first tap delay line for delaying the first signal;

a second tap delay line for delaying the second signal, wherein:

the comparison circuitry uses a comparator, the comparator comprising:
 a first input indicative of the delay through the first tap delay line;
 a second input indicative of the delay through the second tap delay line; and
 outputs indicative of whether the first signal is greater than, less than, or equal to the second signal.

20. A clock doubler comprising:

clock doubling circuitry for generating from a system clock a clock signal having a frequency substantially double that of the system clock and also having a pulse width and associated duty cycle;

timing circuitry for generating a first signal indicative of the time the clock signal is low, and a second signal indicative of the time the clock signal is high comparison circuitry for comparing the first signal and the second signal; pulse width varying circuitry for varying the pulse width of the clock signal based on the result of comparing the first signal and the second signal;

delay chain circuitry for varying the delay of the clock signal;

delay control circuitry for controllably varying the length of the delay chain; and phase determining circuitry for determining the amount of time the clock signal is high and the time the clock signal is low.

21. A method of correcting the duty cycle of a clock doubler comprising:

generating from a system clock a clock signal having a frequency substantially double that of the system clock and also having a pulse width and associated duty cycle;

generating a first signal indicative of the time the clock signal is low;

generating a second signal indicative of the time the clock signal is high comparing the first signal and the second signal; and varying the pulse width of the clock signal base on the result of comparing the first signal and the second signal;

wherein comparing the first signal and the second signal uses a comparator:
 having a first input indicative of the delay through the tap delay line of the first signal;
 having a second input indicative of the delay through the tap delay line of the second signal; and
 having outputs indicative of whether the first signal is greater than, less than, or equal to the second signal.

* * * * *